United States Patent

Hazel

[15] 3,646,307

[45] Feb. 29, 1972

[54] WIRING APPARATUS

[72] Inventor: Herbert K. Hazel, Poughkeepsie, N.Y.

[73] Assignee: International Business Machines Corporation, Armonk, N.Y.

[22] Filed: Sept. 24, 1970

[21] Appl. No.: 75,033

[52] U.S. Cl. .......................................219/80, 219/85, 228/1

[51] Int. Cl. ....................B23k 1/06, B23k 9/12, B23k 11/10

[58] Field of Search ..................219/80, 85; 228/1; 29/470.1, 29/589; 156/73

[56] References Cited

UNITED STATES PATENTS

| | | | |
|---|---|---|---|
| 3,459,355 | 8/1969 | Metzger | 228/1 |
| 2,460,807 | 2/1949 | Chanowitz | 219/80 |
| 3,409,977 | 11/1968 | Johnson | 219/78 |
| 2,564,874 | 8/1951 | Andren | 29/33.5 |
| 3,045,715 | 7/1962 | Monahan et al. | 219/85 |
| 3,314,582 | 4/1967 | Haigler | 228/3 |
| 3,384,283 | 5/1968 | Mims | 29/470.1 |
| 3,444,612 | 5/1969 | Pennings | 228/1 |

OTHER PUBLICATIONS

Twisted Pair Wiring Machine, Bowman, IBM Technical Disclosure Bulletin, Vol. 13, No. 2, July 1970, p. 368.

*Primary Examiner*—J. V. Truhe
*Assistant Examiner*—Hugh D. Jaeger
*Attorney*—Hanifin and Jancin and William S. Robertson

[57] ABSTRACT

Apparatus for automatically bonding wires to spaced terminals has forming means for moving the end of a length of wire into a bonding position with the end thereof presented between the jaws of a clamping and pulling means which clamps the wire end during a bonding and then pulls the wire to break off a portion thereof beyond the bond, the forming means being also used to determine the shape and height of staples between bonds. A stripper removes the insulation from the portion of wire to be bonded. For bonding paired wires simultaneously to a terminal pad and a ground grid, the apparatus includes a spreader which positions both wires accurately in bonding grooves of a bonding tip and a twister for twisting the paired wires between bonds.

15 Claims, 23 Drawing Figures

WIRING APPARATUS

This invention relates to apparatus for automatically connecting wire elements between two or more terminals on a base such as a card.

It is an object of the invention to provide automatic assembly of single and multiple interconnections between terminals—preferably under the control of a program stored in a computer memory or on cards—with apparatus that is compact, reliable, efficient and capable of assembling circuitry with an extremely high degree of accuracy.

Another object of the invention is to provide such interconnections with apparatus which effectively strips the insulation from the portions of the wire which are to be bonded to the terminals and automatically and efficiently removes scrap wire.

Still another object of the invention is to provide automatic determination of the shape and height of individual interconnecting wire staples as they are being connected between terminals.

Yet another object of the invention is to provide apparatus which automatically and uniformly twists two wire staples between consecutive bonds and may be employed to bond one wire to a terminal and the other to a ground grid.

In one aspect the invention features novel and improved forming means for use with apparatus for connecting a wire between spaced terminals on a panel disposed in a plane, the apparatus including positioning means for supporting the panel in a working position, bonding means arranged to bond a portion of the wire to a terminal, feeding means for feeding a length of wire from a wire supply to a position above the panel adjacent the bonding means, and clamping and pulling means arranged to clamp a leading end of the wire and to engage the wire at a predetermined time. In preferred embodiments the forming means is arranged to move the leading end of the length of wire into the clamping and pulling means and to position a portion of the wire for bonding to the terminal by the bonding means; the bonding means has a groove disposed therein for effectively bonding the portion to the terminal and the forming means is arranged to guide the portion into the groove, the clamping means being effective to hold the portion in the groove.

In another aspect the invention features spreading means for use with such wire connection apparatus for connecting portions of two wires, one to a terminal and the other to a ground grid spaced apart and insulated from the terminal, the bonding means of the apparatus having two spaced grooves each arranged to effectively bond a portion of one of the wires either to a terminal or to a ground grid. The spreading means effectively spreads the wires by a predetermined amount and the wires after being spread are positioned for the portions to be engaged by the grooves for bonding. In preferred embodiments a forming means is arranged to guide the portions into the respective grooves, the clamping means being effective to hold the portions in the groove. In this aspect of the invention, the apparatus also includes twisting means arranged to twist the wires uniformly a predetermined number of times between individual bonding operations, thereby to insure that the wires are impedance matched and have impedances of proper magnitudes.

Still another aspect of the invention features novel and improved stripping means for uniformly and effectively stripping insulation from the portions to be bonded, the stripping means including a pair of electrodes arranged to generate an arc for stripping the insulation in the gap therebetween, means for positioning the electrodes adjacent a portion to be stripped and means for moving the arc to effectively strip all of the insulation from the portion. When two wires are to be bonded, the stripping means advantageously includes means for spreading the wires in the gap arranged to insure that all of the insulation is stripped from both portions of the wire to be bonded.

In yet another aspect a positioning means is operative after a first bonding operation has been completed to position a second terminal for a second bonding operation, the forming means being arranged to determine the shape and height of the wire connected between consecutive bonds.

Other objects, features, and advantages will become apparent from the following description of a preferred embodiment of the invention, taken together with the following drawings, thereof, in which:

FIG. 6A shows the apparatus positioned for stripping the insulation from the wires at the first potion thereof to be bonded to a terminal;

FIG. 6B shows the apparatus with the wire feed unit in the home position ready for spreading, positioning and bonding;

FIG. 6C shows the apparatus with a spreader between the wires immediately below the bonding tip;

FIG. 6D shows the apparatus after the stripped portions of the wires have been wiped into grooves in the bonding tip and their leading ends have been formed into the clamp;

FIG. 6E shows the apparatus with the bonding tip positioned for bonding the stripped portion of the wire to a terminal pad and a stripped portion of the other wire to a ground grid and with the clamp closed and gripping both leading ends;

FIG. 6F shows the apparatus, after the leading ends have been broken off and the wires have been properly twisted, with the stripper in position to perform the second stripping of insulation from the wires shown in dotted lines;

FIG. 6G shows the apparatus with the former in position for forming the beginning of a wire staple between terminals;

FIG. 6H shows the apparatus with the feeding unit in the home position for the second bonding operation after the former has been retracted and the *xy* positioning system has moved the card to a new position;

Figures 6A, 6B, 6C:
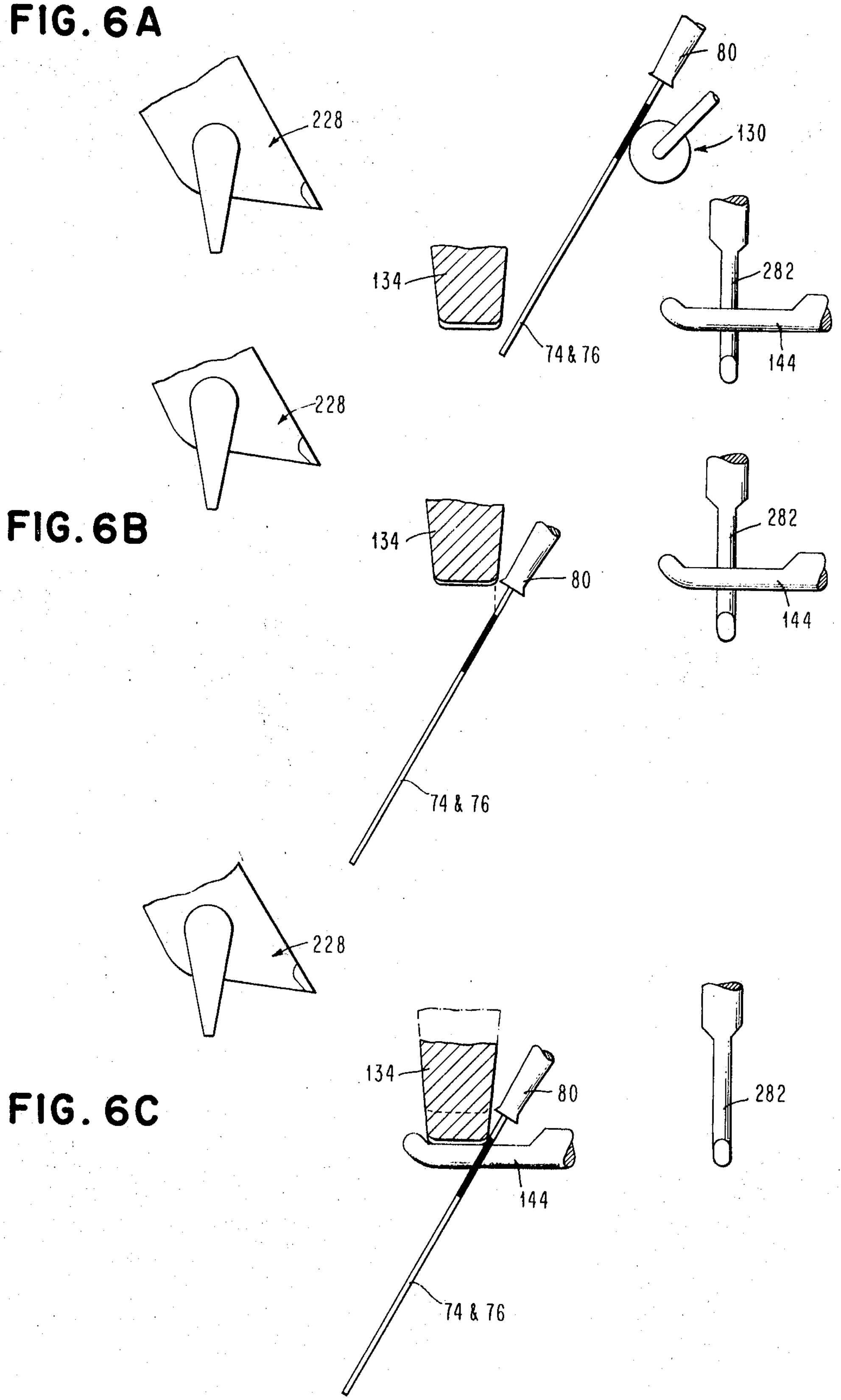
FIGS. 6A through 6J are detailed views of relevant portions of the apparatus of FIGS. 1A through 5C showing the sequence of operation of the apparatus. In particular.
Figures 6D, 6E, 6F:
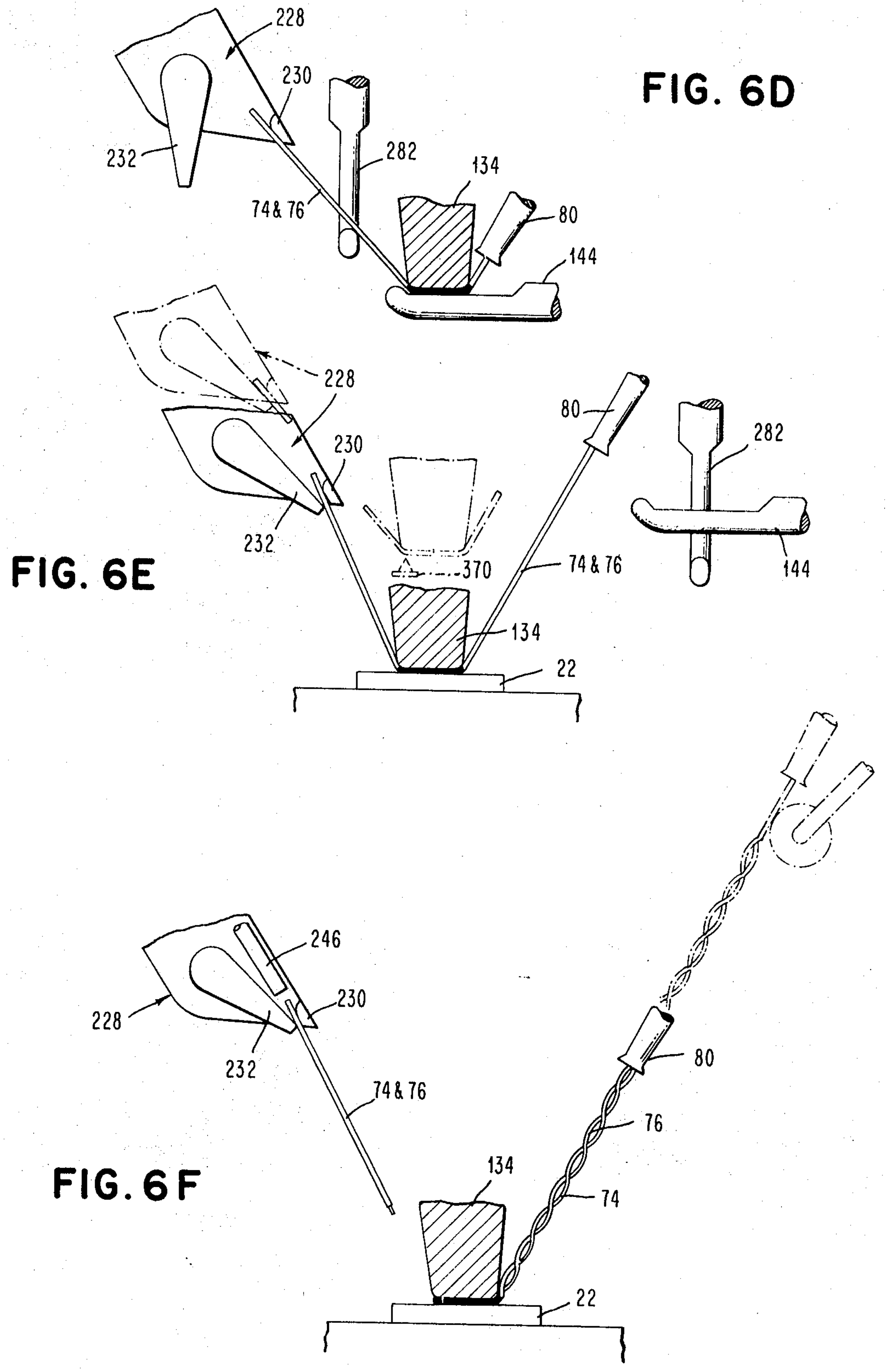
Figure 6G:
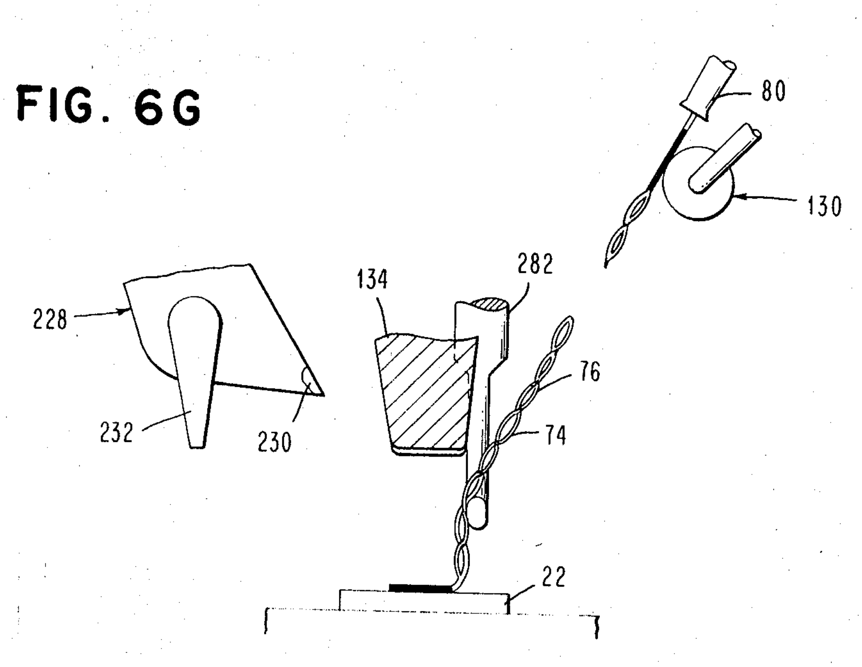
Figure 6H:
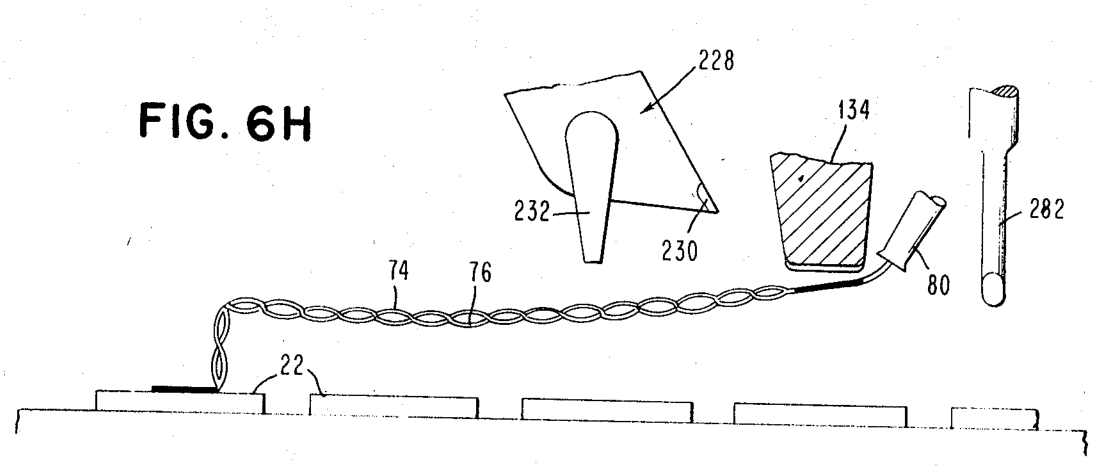
Figure 6I:
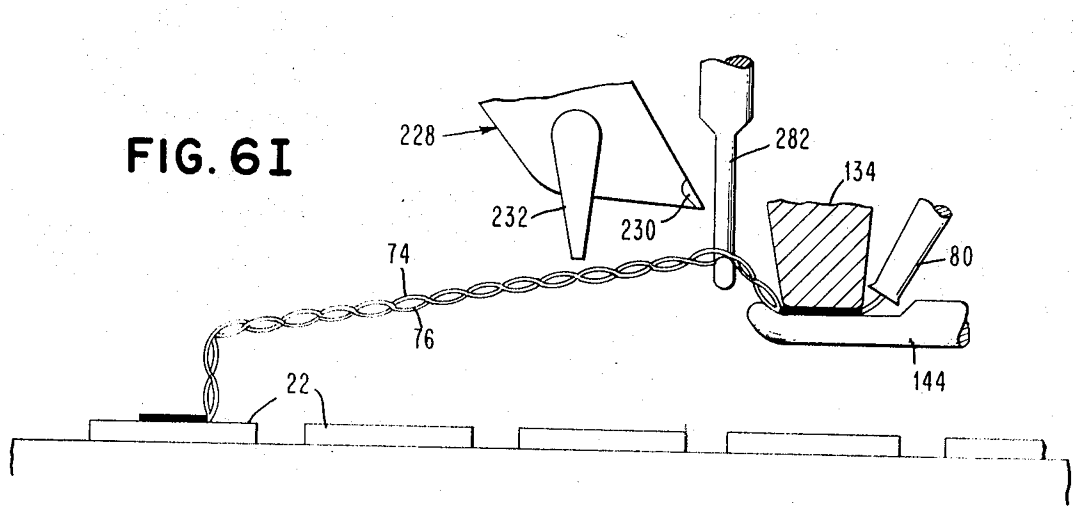
Figure 6J:
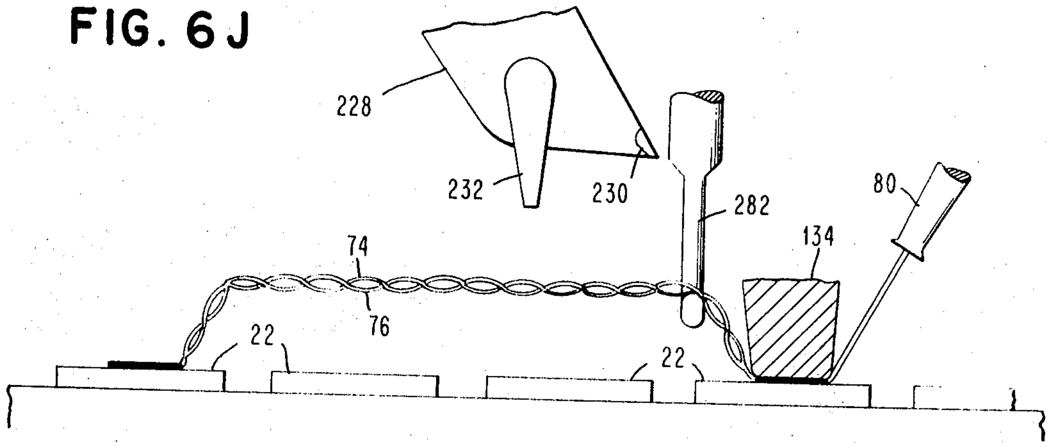
Figure 8A:
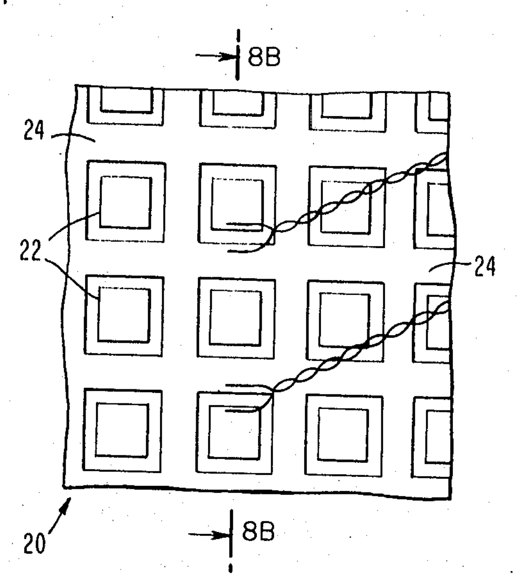
Figure 7:
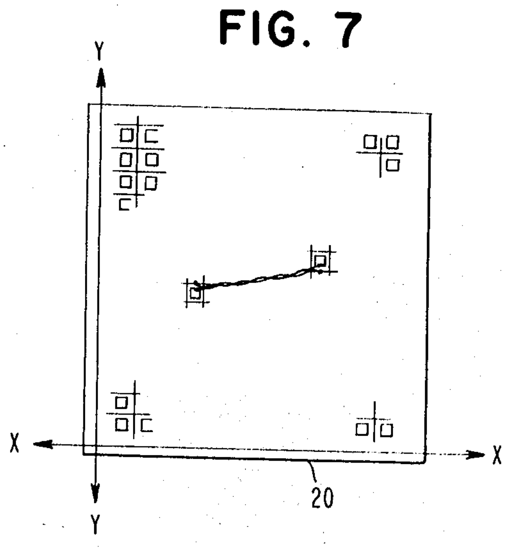
Figure 8B:
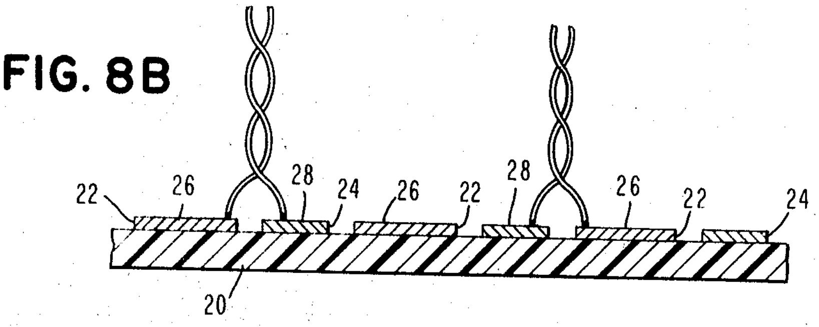

FIG. 6I shows the apparatus with the feeding tube in the home position and with the former positioned for forming the end of the wire staple after it has wiped the wires into the bonding top grooves; and FIG. 6J shows the apparatus with the bonding tip in the position in which the second stripped portions of the wire staple are bonded and with the feeding tube retracted and the former remaining in the forming position;

FIG. 7 is a top elevation of a card panel with a two-wire staple bonded thereon;

FIG. 8A is a magnified top elevation of a portion of a panel showing the details of connection of two wire bonds; and FIG. 8B is a magnified cross section, taken along line 8B—8B in FIG. 8A of a portion of the card shown in FIG. 8A.

Figures 1A, 1B:
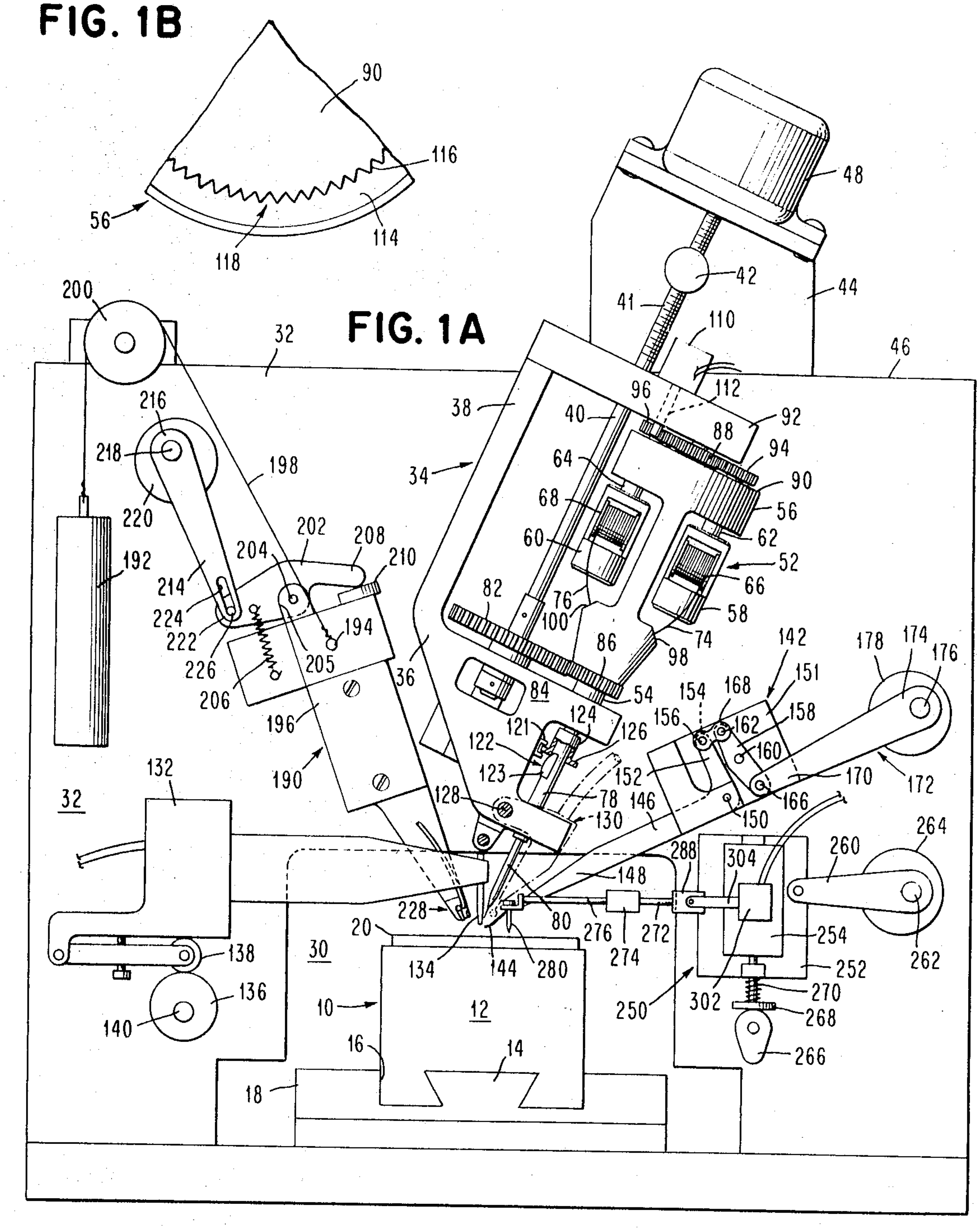
FIG. 1A is a front elevation of wiring apparatus constructed in accordance with the invention for the simultaneous bonding of paired wires.
FIG. 1B is a partially diagrammatic view of a portion of the top surface of the twisting unit of FIG. 1A.

Referring to FIG. 1A, the apparatus generally comprises a frame 32, supporting a work-positioning system generally designated 10, a wire feed and twisting assembly 34, a wire stripper 130, a bonding unit 132, a wire spreader 142, a wire clamping mechanism 190, and a forming unit 250.

Referring now to FIG. 1A, there is shown a standard numerical control $x$—$y$ positioning system, generally designated 10, such as those commonly in use for positioning machine tools and workpieces. System 10 is controlled by a program in a computer (not shown) and has a platform member 12 movable in opposite directions (along a $y$-axis) along dovetail 14 disposed in a recess 16 in a second member 18 of system 10 which is movable in opposite directions perpendicular (along an $x$-axis) to movement of platform member 12. A circuitry panel or card 20 (FIGS. 7, 8A, and 8B) constructed of hard ceramic material, having etched thereon an array of terminal pads 22 (0.024 inch square and spaced 0.029 inch from center to center) and a ground grid 24 disposed between and around and being insulated from pads 22, is secured by any suitable means on platform member 12 and is arranged to be moved, by positioning system 10, predetermined amounts (under computer control) in the $x$-direction only, the $y$-direction only, or in both the $x$- and $y$-directions substantially simultaneously—and therefore effectively to move at an angle to both the $x$- and $y$-axes. The respective thicknesses of terminal pads 22 and ground grid 24 are the same and, therefore, their upper surfaces, 26 and 28, respectively, are coplanar.

The interconnection apparatus has its moving parts mounted on a back frame 32 having a central opening 30 in which positioning system 10 and card 20 are disposed, and is operated by individual motors under computer control. A wire feed and twisting assembly 34 has a housing 36 with a substantially U-shaped upper portion 38 and is mounted on a shaft 40 which is threaded (by threads 41 which have a small pitch) through a boss 42 fixed to a block 44 mounted on the top 46 of frame 32. A program controlled reversible motor 48 having an internal splined shaft engaging the threads 41, is provided to rotate shaft 40 for raising and lowering housing 36 and the moving parts supported thereon.

Wire twisting assembly 52 is rotatably mounted within U-shaped portion 38 on a shaft 54 disposed parallel to shaft 40 and has a main body 56 which carries wire spool holders 58 and 60 which are arranged to rotate relative to body 56 on shafts 62 and 64 respectively. Spool holders 58 and 60 respectively have spools 66 and 68 arranged to rotate about axes transverse to the axes of shaft 54 for feeding single insulated wires 74 and 76, respectively, downwardly through feeding tube 78 to feeding tip 80. A gear 82 is secured to shaft 40 adjacent the lower leg 84 of U-shaped portion 38 and is arranged to mate with and to rotate a gear 86 slippably fit to shaft 54. A second gear 88 is secured to shaft 54 between the top surface 90 of body 56 and the upper leg 92 of U-shaped portion 38 and is arranged to mate with and rotate corresponding gears 94 and 96 secured to shafts 62 and 64, respectively, and therefore, when gear 82 rotates gear 86 and body 56 rotating spool holders 58 and 60 relative to body 56. Such rotation of spools 58 and 60 maintains them in a fixed wire feeding orientation relative respectively to the lower portions 98 and 100 of body 56 into which they feed wires 74 and 76, respectively.

The small pitch of threads 41, together with the gear ratio between gears 82 and 86 provide 40 rotations of body 56 for each inch of longitudinal movement of shaft 40.

Figure 1C:
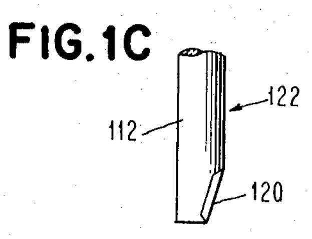
FIG. 1C is a side view of the bottom end of the stop pin for the twisting unit.
Figure 1D:
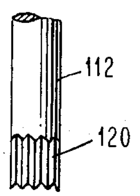
FIG. 1D is a view of the back of the bottom end of the stop pin.

A computer operated spring-biased solenoid 110 is provided on upper leg 92 for actuating a stop pin 112 disposed substantially within upper leg 92 between an upper position in which body 56 is free to be rotated by gears 82 and 86 and a lower position in which stop pin 112 engages the top surface 90 of body 56 and gear 86 slips around shaft 54 when gear 82 rotates and body 56 does not rotate. Referring to FIGS. 1B, 1C and 1D, top surface 90 has a circumferential channel 114 (only a portion of which is shown in FIG. 1B) disposed near the outer edge of body 56 and having a plurality of continuous circumferential teeth 116 cut in its inner edge 118. Stop pin 112 has a plurality of teeth 120 disposed in the lower end of the back side 122 thereof. Since teeth 116 are disposed continuously in edge 118, when stop pin 112 is lowered by solenoid 110, teeth 120 on stop pin 112 engage teeth 116 no matter what rotary position body 56 is in and prevent further rotation of body 56 until solenoid 110 raises stop pin 112.

A wire clamp 122 having a convex outer surface 123 is pivotally mounted in an opening in feeding tube 78 and is balanced to have a normally open position in which the wires disposed in tube 78 are unclamped. A cylindrical collar 124 having an annular flange 126 at the bottom thereof is disposed immediately above clamp 122 and is slidably mounted for longitudinal movement along tube 78 by slide member 121 under control of a solenoid (not shown) mounted on housing 36. When the solenoid is energized, slide member 121 moves flange 126 over surface 123 of clamp 122 which pivots and clamps the wires in tube 78. When the solenoid is deenergized, flange 126 remains above clamp 122, and the wire within tube 78 is unclamped. Housing 34 also carries a shaft 128 on which insulation stripper 130 (suggested by dotted lines in FIG. 1) is slidably and pivotally mounted.

A conventional ultrasonic bonding unit 132 having a bonding tip 134 disposed above card 20 and with two spaced parallel bonding grooves, for bonding wires 74 and 76, respectively, to a pad 22 and to ground grid 24, is slidably mounted by any suitable means on frame 32 for vertical movement and is arranged to be moved up and down by a cam 136 coacting with a roller 138 on an arm pivoted to unit 132. Cam 136 is secured to shaft 140 which is rotated by a program-controlled motor (not shown). A wire spreader 142 includes a spreader tip 144 for spreading the wires 74 and 76 fed through feeding tip 80 a predetermined distance apart to conform to the separation between the grooves in bonding tip 134 and has a generally L-shaped arm 146 (having a leg portion 148) extending from spreader tip 144 to a stationary pin 150 on a slide 151 mounted for lateral downward movement on frame 32, arm 146 being pivotal on pin 150. A foot portion 152 extends from pin 150 to end 154 in which pin 156 is secured. Spreader 142 has second rotary arm 158 arranged to be pivoted about pin 160 (also mounted on slide 151) and having pins 162 and 166 secured in opposite ends thereof. Foot portion 152 of arm 146 and arm 158 are pivotally connected at pins 156 and 162, respectively, by a connector 168, and pin 166 is pivotally connected to one end 170 of actuating arm 172 which pivots arm 158 about pin 160. The other end 174 of actuating arm 172 is pivotally connected to pin 176 on cam 178 which is arranged to be rotated by a third motor (not shown) controlled by the program.

Thus, when cam 178 is rotated from its position shown in FIG. 1, slide 151 is moved laterally downwardly to a stop position carrying forming tip 144 toward the wires 74 and 76 fed from feeding tip 80 and tip 144 is moved upwardly between the wires by the cooperating pivoting of arms 158 (about pin 160) and 146 (about pin 150). The reverse motion takes place when cam 178 is returned to the position of FIG. 1.

Figure 2:
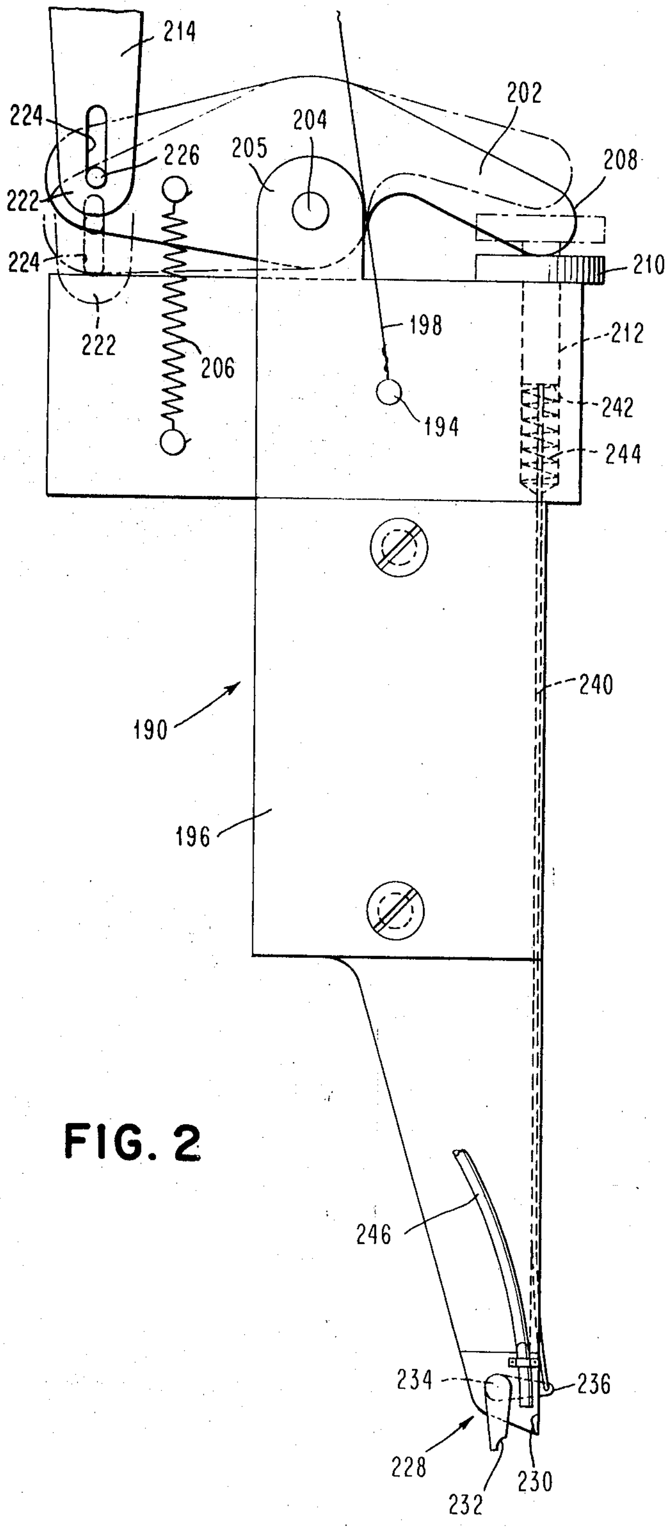
FIG. 2 is a detailed front elevation of the clamp mechanism shown in FIG. 1.
Figure 3:
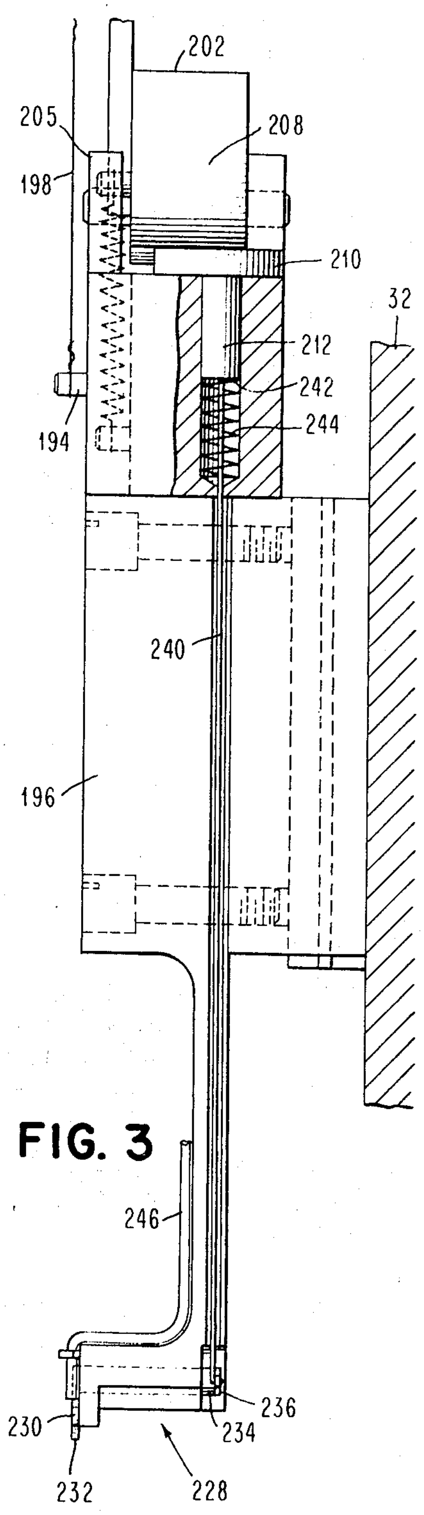
FIG. 3 is a detailed side elevation of the clamp mechanism.

The clamp mechanism, generally designated 190 (FIGS. 1, 2 and 3), is disposed at an angle from the vertical and is mounted for reciprocating sliding movement on frame 32. A weight 192 is connected to pin 194 on the housing 196 of clamp mechanism 190 by a wire 198 which passes over rotatable pulley 200 on frame 32 and provides a counterbalance (in a manner to be described in more detail below) for clamp mechanism 190. A rocker 202, pivotally mounted above housing 196 on pin 204 on an arm 205 projecting above the housing, is normally biased to its counterclockwise position by spring 206, and has end camming surface 208 arranged to depress the head 210 of shaft 212 (FIG. 2) when rocker 202 is pivoted clockwise. An actuating arm 214 has end 216 pivotally connected to pin 218 on cam 220 (which is rotated by a fourth motor (not shown) under program control). Arm 214 has near the opposite end 222 an elongated slot 224 in which pin 226 (adjacent spring 206 on rocker 202) is disposed, and is arranged, when housing 190 is in its uppermost position and arm 214 has moved pin 226 upwardly, to move rocker 202 clockwise until end camming surface 208 depresses head 210. The clamp 228 has a stationary jaw 230 (FIG. 2) and a movable jaw 232 mounted on pin 234 rotatable in housing 196 by a link 236. Link 236 is pivotally connected to rod 240 which extends upwardly along housing 196 and is secured to the bottom 242 of shaft 212 which is biased by spring 244 in an upward position in which jaws 230 and 232 are closed. Thus clamp 228 opens only when end camming surface 208 depresses head 210 of shaft 212 to overcome the force of spring 244. A hose 246 connected to a vacuum source (not shown) is mounted adjacent clamp 228.

In FIG. 1A pin 218 is shown at its upper position on cam 220, rocker 202 has been rotated clockwise by arm 214 depressing head 210 of shaft 212 and clamp 228 is open. With clamp mechanism 190 in position the leading ends of the wires to be bonded are formed (in a manner to be described in greater detail below) upwardly around bonding tip 134 into clamp 228. At that time, cam 220 is rotated permitting spring 206 to rotate rocker 202 clockwise and camming surface 208 rises, permitting spring 244 to turn lever 236 causing jaw 232 to clamp the leading ends of the wires. Bonding tip 134 is lowered toward panel 20 as pin 218 rotates to its lowest position and the counterbalanced mechanism 190 is pulled downward by the clamped wires engaged with the bonding tip. During this motion, pin 226 remains in a position intermediate the ends of elongated slot 224. After bonding, cam 220 returns pin 218 toward its upper position pulling clamping assembly 190 to the upper limit of its slide without opening clamp 228, thus breaking off the wire ends. As pin 218 moves further upward to its topmost position on cam 220 with further upward movement of the clamping mechanism prevented, rocker 202 again is rotated clockwise and clamp 228 opens, releasing the scrap ends, which are vacuumed into hose 246 before they can drop to the panel 20 where they could cause short circuits. Completion of the cam cycle returns the clamp mechanism to starting position by the pull of arm 214 on pin 218.

Figure 4:
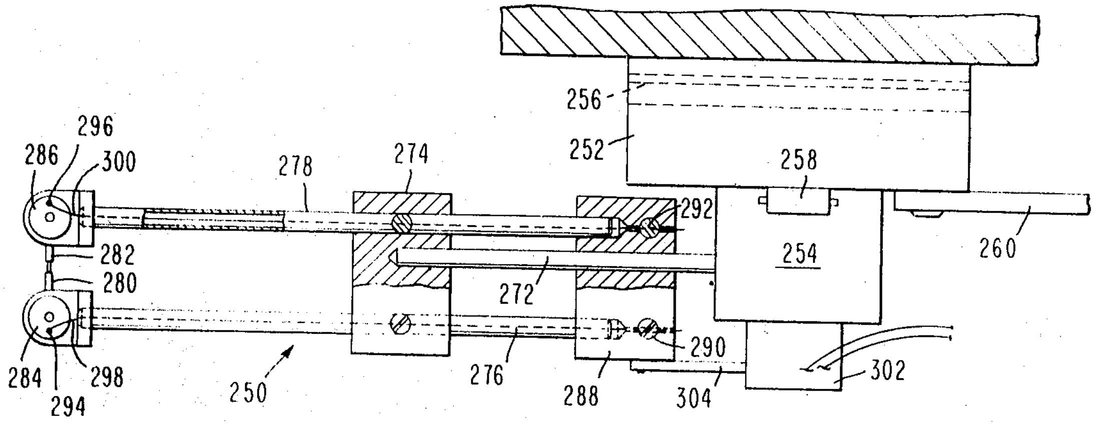
FIG. 4 is a detailed top elevation of the forming unit shown in FIG. 1.

The forming unit 250 of the assembly is shown in FIG. 1A and in greater detail in the top elevation view of FIG. 4. Forming unit 250 has two movable supporting members 252 and 254 arranged to be reciprocated horizontally and vertically on channels 256 and 258, respectively. Member 252 is reciprocated by actuating arm 260, which is pivotally secured between member 252 and pin 262 on rotatable cam 264, and member 258 is reciprocated by rotatable cam 266, which cooperates with head 268 on threaded manual adjustment screw 270 mounted in the bottom of member 254. Individual motors under program control are provided to rotate cams 264 and 266. A fixed rod 272 is mounted on one side of member 254 and supports a rectangular tube holder 274 which in turn slidably supports two hollow tubes 276 and 278 parallel to each other and spaced apart by a predetermined amount. Fingers 280 and 282 are secured to rotatable spring-biased cranks 284 and 286, respectively, at the respective ends of tubes 276 and 278 remote from member 254. When cranks 284 and 286 are spring biased only, fingers 280 and 282 extend downwardly and inwardly toward each other and come together at their ends substantially forming a "U." A rectangular wire lock 288 is slidable mounted on the other ends of tubes 276 and 278, is slidable on rod 272, and includes two pins 290 and 292 for locking the ends of wires. Cranks 284 and 286 have off center pins 294 and 296, respectively, secured to which are wires 298 and 300 which extend therefrom through tubes 276 and 278 to pins 290 and 292 in wire lock 288. As is apparent, if wire lock 288 is retracted relative to tube holder 274, cranks 284 and 286 will be rotated by wires 298 and 300, respectively, and fingers 280 and 282 will open. When the retracting force is removed, the springs in cranks 284 and 286 will return fingers 280 and 282 to the closed position also returning lock 288 to normal position relative to tube holder 274. For this purpose a small solenoid 302 (under program control) arranged to position a link 304 is mounted on member 254. Link 304 is connected between solenoid 302 and wire lock 288 and transmits the programmed retraction and release of wire lock 288 to open and close fingers 280 and 282 when desired.

Figure 5A:
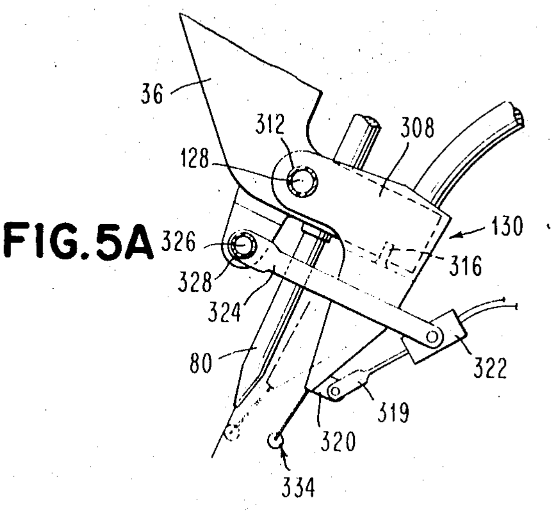
FIG. 5A is a front elevation of the insulation stripping assembly, the outline of which is suggested by dotted lines in FIG. 1, and of the feeding tube shown in FIG. 1.
Figure 5B:
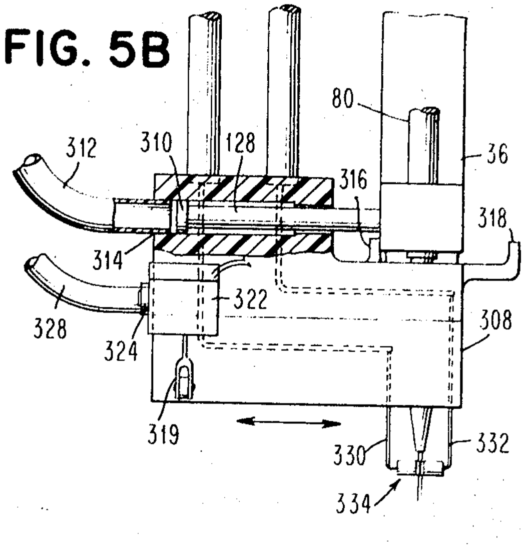
FIG. 5B is a detailed top view of the stripping assembly showing the mounting thereof.
Figure 5C:
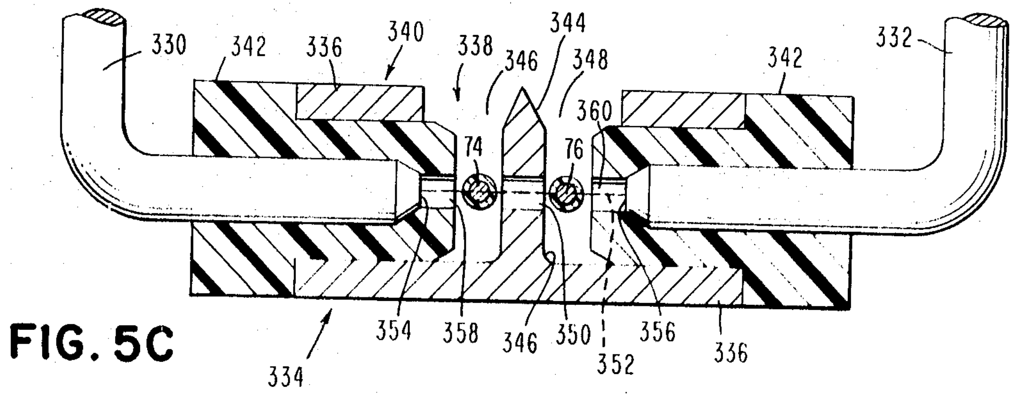
FIG. 5C is a detailed back elevation of the insulation stripper shown in FIGS. 5A and 5B.

Insulation stripper 130 (FIGS. 1A and 5A, 5B, and 5C) having a plastic housing 308 is rotatably supported on shaft 128. Stripper 130 is arranged (FIG. 5B) to be moved longitudinally along shaft 128 between an outer position and an inner position. In the outer position stripper 130 is removed from the region in which the other moving parts operate, while in the inner position, the stripper is closer to lower portion 36 of twisting unit housing 34, and is positioned for rotation about shaft 128 to a position to strip the wires. Stripper 130 is moved to its outer position by air pressure applied to end 310 of shaft 128, through a hose 312 connected to opening 314 in body 308 and is moved to its inner position by suction similarly applied. The extent of movement of body 308 along shaft 128 is limited by stops 316 and 318 on body 308 which engage the front and rear surfaces of the lower portion of twisting unit housing 36. Stripper 130 is arranged to be pivoted about shaft 128 by a link 319 which is pivotally connected to the lower end 320 of body 308 and which is moved by computer-controlled solenoid 322. Solenoid 322 is pivotally secured to arm 324 which is mounted on shaft 326 on housing 36 and has a pneumatic system similar to that shown in FIG. 5B for body 308, air pressure or vacuum being applied to arm 324 through hose 328. This pneumatic system causes arm 324 to move longitudinally along shaft 326, to move with or "track" the longitudinal movement of body 308 along shaft 128. Arm 324 is nonrotatably keyed to shaft 326. Stripper 130 has suitably insulated high voltage electrodes 330 and 332 (FIG. 5C) which extend downwardly to a cylindrical stripping head 334. Stripping head 334 has a tubular metal grid 336 with an opening 338 in the leading surface 340. Electrodes 330 and 332 are disposed within opposite ends of grid 334 and are insulated therefrom by high-temperature insulating material 342 which terminates at the outer edges of opening 338. A metal protrusion 344 extending from inner rear surface 346 of metal grid 334 toward leading surface 340, divides opening 338 into two chambers 346 and 348 (defining air gaps) each for receiving a wire to be stripped and has a tapered midportion which enters between the wires to guide them into the respective chambers. Protrusion 344 has a central opening 350 surrounding the axis 352 along which the ends 354 and 356 of electrodes 330 and 332 are located. Corresponding central openings 358 and 360 are provided in insulation 342 adjacent ends 354 and 358 of the electrodes. Suitable leads are provided from a source of AC voltage sufficient to cause an arc to bridge the gap between ends 354 and 356 of electrodes 330 and 332. When the stripping head is in the position shown in FIG. 5C and an arc has been struck, the current to solenoid 322 is rapidly fluctuated imparting a slight oscillatory motion to grid 334 to insure that the arc contacts and strips all of the insulation from wires 74 and 76.

In operation of the device of the invention a card 20 is secured in place on supporting member 12, and the program is started. The $X$–$y$ positioning system 10 moves card 20 to the position in which the first commanded bond is to be made.

All of the motions of the individual parts of the assembly are controlled by the program stored in the computer as described above. Initially (FIG. 6A) lengths of wires 74 and 76 extend from wire feeding tip 80 as a result of the previous bonding operation in which tip 80 was moved (stop pin 112 being in its retarding position) from the "home" position to a more remote position from the bond before the wires were snapped off adjacent the bond. Insulation stripper 130 is moved inwardly on shaft 128 by the pneumatic system and is pivoted toward wires 74 and 76 until stripping head 334 is in the stripping position shown in FIG. 5C. The AC voltage source generates an arc between electrodes 330 and 332, stripping head 334 is oscillated slightly, and the insulation on the portion of wires 74 and 76 with chambers 346 and 348 is stripped from the wires. Stripping head 334 is rotated away from wires 74 and 76 and stripping unit 130 is moved longitudinally along shaft 128 to a position out of the working region. Wire feed and twisting unit 34 is moved to the "home" position (FIG. 6B) with stop pin 112 in its retarding position, and spreading tip 144 is advanced between wires 74 and 76 (FIG. 6C) to guide the stripped wire portions into the grooves in the bottom of bonding tip 134. Forming unit 250 advances forward toward the leading ends of wires 74 and 76 with fingers 280 and 282 in the closed position, engages the leading ends as it sweeps past them, and (FIG. 6D) when fingers 280 and 282 have passed beyond bonding tip 134, forming unit 250 is swept upwardly until the leading ends of the wires have been swept against stationary jaw 230. Spreader tip 144 is then retracted. Movable jaw 232 is closed (FIG. 6E) as described above. Bonding tip 134 is lowered and carries the stripped portions of wires 74 and 76 down respectively to a terminal pad 22 and a portion of ground grid 24 (not shown). The counterbalanced clamp 228 which is also carried down from a dotted line position, in which it clamped the leading ends, to a full line position, holds the stripped portions of wires 74 and 76 in the grooves. Clamp mechanism 190 is then retracted with a force sufficient to snap off the leading ends of wires 74 and 76 adjacent the bond. (Some wires do not snap off easily after the bonding operation. Thus, provision may be made as by notcher 370 shown in dotted lines in FIG. 6E for notching the wires at the point of desired break before bonding tip 134 is lowered toward a terminal 22.) A vacuum source is connected through hose 246, clamp 228 is opened, the scrap ends are carried into hose 246 to waste, and the vacuum source is turned off.

Wire clamp 122 is released, and unit 34 is retracted (FIG. 6F) with stop pin 112 removed from its retarding position, and wires 74 and 76 are fed out and twisted for a programmed length. Stop pin 112 is moved into its retarding position, and straight lengths of wires 74 and 76 are fed from feeding tip 80 by further retraction of the feeding unit (FIG. 6G). The wires are clamped and stripping unit 130 is brought back into its stripping position, strips the insulation from portions of the wires, and is removed from the working region. Forming unit 250 is moved in towards wires 74 and 76 with fingers 280 and 282 closed and comes into contact (FIG. 6G) with the wires at the staple height determined by the program. The card is moved by the positioning system to position another terminal and grid portion under the bonding tip and the forming fingers are retracted (FIG. 6H). Bonding tip 134 is lowered to engage the stripped portions of wires 74 and 76 (FIG. 6I) and spreader tip 144 moves between them. Forming unit 250 moves inwardly with fingers 280 and 282 open around bonding tip 134; fingers 280 and 282 then close to engage the lower edges of wires 74 and 76 at a height determined by the program. Wire clamp 122 is released, and tip 80 is retracted a predetermined distance to clear the bonding tip. Bonding tip 134 moves the stripped portions of wires 74 and 76 downwardly into bonding position (FIG. 6J). At the same time forming unit 250 moves downwardly holding the wires and forming the second end of the wire staple while the spreader is withdrawn. After the stripped portions are bonded to the pad, fingers 280 and 282 are opened and the wire-forming unit 250 is retracted. Wire-feeding unit 34 retracts a predetermined distance, either twisting the wires if a continuous staple network is to be assembled or with stop pin 112 in its retarding position if the last bonds are to terminate an interconnection, with bonding tip 134 locked down. If any last bonds terminate an interconnection, feeding tip 80 is retracted with the wires clamped until sufficient force is exerted to break the wires off adjacent bond tip 134. Provision for notching wires adjacent bonding tip 134 may be made when the nature of the wires is such that they do not easily break off.

Thus, it will be seen that the invention provides forming of networks of interconnections—either continuous staples or single staples—and even permits staples to cross each other with any degree of complexity as determined by the program. When a single wire rather than wire pairs are to be bonded, only one wire is fed from tube 80, and the twisting and spreading mechanisms are not used, the operation being otherwise the same, with only one of the two stripping compartments 344 and 346 and one of the bonding tip grooves being utilized or with single compartment stripper and single grooved bonding tip substituted.

What is claimed is:

1. Apparatus for connecting a wire to a terminal on a base comprising:
- positioning means for supporting said base in a working position;
- bonding means arranged to bond a portion of said wire to a said terminal;
- feeding means for feeding a length of said wire from a wire supply to a position adjacent said bonding means;
- clamping means arranged to clamp a leading end of said wire; and
- forming means movable to engage and sweep the leading end of said length of wire into said clamping means and to position said portion of said wire for bonding to said terminal by said bonding means.

2. Apparatus according to claim 1 wherein said bonding means has a groove disposed therein, said groove being arranged to receive said wire portion for effectively bonding said portion to said terminal, and
- said forming means is arranged to guide said portion into said groove,
- said clamping means being effective to hold said portion in said groove.

3. Apparatus according to claim 2 wherein said bonding means is arranged to urge a said wire portion disposed in said groove against a said terminal and to bond said portion to said terminal.

4. Apparatus according to claim 3 wherein said clamping means is arranged, when said bonding means has bonded a said portion in place against a said terminal, to pull said leading end with sufficient force to break said wire adjacent said bonding means.

5. Apparatus according to claim 2 wherein:
- said forming means has a retracted position at the opposite side of said bonding means from said clamping means;
- said feeding means is arranged to feed said wire length between said bonding means and said forming means with the leading end of said wire extending substantially beyond said bonding means; and
- said forming means is arranged to be projected under said bonding means to engage said leading end and to sweep said leading end upwardly into said clamping means while guiding said wire portion into said groove.

6. Apparatus according to claim 1 further comprising means for stripping insulation from said wire portion preliminary to bonding thereof.

7. Apparatus according to claim 6 wherein said means for stripping comprises structure defining an opening arranged to be disposed about said wire portion and means for generating an arc disposed within said opening and arranged to effectively remove said insulation from said portion.

8. Apparatus according to claim 1 wherein:
- said feeding means is arranged to feed a length of a second wire simultaneously to said position;
- said clamping means is arranged to clamp the leading end of each of said wires;
- said forming means is arranged to engage and sweep the leading ends of each of said wires into said clamping means and to position a portion thereof for bonding; and
- said bonding means is arranged to bond a said portion of each of said wires to a terminal.

9. Apparatus according to claim 8 wherein:
- said bonding means includes two grooves for receiving and effectively bonding said respective wire portions and which further includes spreader means movable in advance of said forming means to a position between said wires to assist said forming means in guiding said wires into said respective grooves.

10. Apparatus according to claim 8 which further includes means for stripping insulation from each of said wire portions preliminary to bonding thereof.

11. Apparatus for connecting a wire between spaced terminals on a base comprising:

means for supporting said base and for relatively moving said base with respect to the rest of the apparatus to present said terminals successively to a working position;
bonding means movable to and from a bonding position;
feeding means operable to feed a length of said wire to a position for bonding of a portion thereof to a first said terminal;
means for operating said bonding means to bond said wire portion to a first said terminal working position and to move away from bonding position;
forming means movable to engage a first portion of said wire between said bonded portion and said feeding means to form a first bend therein at a predetermined distance above said base;
said feeding means being operable, during relative movement of said base for presenting a second said terminal to said working position, to feed wire corresponding to the amount of said movement;
said forming means being movable to engage said wire at a second position adjacent said second terminal to position a portion of said wire for bonding by said bonding means and to form a second bend in said wire at a predetermined distance above said base;
and means for operating said bonding means to bond said last-named wire portion to said second terminal.

12. Apparatus according to claim 11 which includes means operable after bonding of said wire to said second terminal to clamp and pull the wire extending between said welded portion and said feeding means to break said wire adjacent said bond.

13. Apparatus according to claim 11 which includes means for stripping insulation from said wire portions to be bonded to said respective terminals prior to the bonding thereof.

14. Apparatus for connecting a wire between spaced terminals on a base comprising:
means for supporting said base and for relatively moving said base with respect to the rest of said apparatus to present said terminals successively to a working position;
bonding means for bonding portions of said wires to said respective terminals;
feed means operable upon bonding of a first portion of said wire to a first terminal in said working position to feed a predetermined length of said wire to extend between said first bonded portion and a second portion to be bonded to a second terminal in said working position; and
forming means having a pair of fingers mounted on either side of a plane formed by said bonding tip and said wire feed means and movable with respect to said bonding tip and rotatable between opened and closed positions for engaging and bending said length of said wire at spaced points to form a staple of predetermined height extending between said terminals when said second wire portion is bonded to said second terminal.

15. Apparatus for simultaneously connecting two wires to terminals on a base comprising:
positioning means for supporting said base in a working position;
bonding means having a bonding tip provided with a pair of grooves for receiving portions of said respective wires therein, said tip being movable to and retractable from a bonding position with respect to a said terminal;
means for feeding portions of said wires into said grooves while said bonding tip is retracted, including a spreader which is advanced between said wire portions beneath said tip to guide said wires toward said slots and is thereupon retracted and forming movable to engage and sweep the leading ends of said wires across said bonding tip; and
means for moving said bonding tip to bonding position after said wires are fed into said grooves.

* * * * *